(12) United States Patent
Inagaki et al.

(10) Patent No.: US 12,160,958 B2
(45) Date of Patent: Dec. 3, 2024

(54) MOUNTING DEVICE AND METHOD FOR CONTROLLING MOUNTING DEVICE

(71) Applicant: FUJI CORPORATION, Chiryu (JP)

(72) Inventors: Mitsutaka Inagaki, Anjo (JP); Shigeto Oyama, Kariya (JP); Haruna Narita, Higashiura-cho (JP)

(73) Assignee: FUJI CORPORATION, Chiryu (JP)

( * ) Notice: Subject to any disclaimer, the term of this patent is extended or adjusted under 35 U.S.C. 154(b) by 394 days.

(21) Appl. No.: 17/629,305

(22) PCT Filed: Jul. 24, 2019

(86) PCT No.: PCT/JP2019/029050
§ 371 (c)(1),
(2) Date: Jan. 21, 2022

(87) PCT Pub. No.: WO2021/014615
PCT Pub. Date: Jan. 28, 2021

(65) Prior Publication Data
US 2022/0256751 A1    Aug. 11, 2022

(51) Int. Cl.
H05K 13/08    (2006.01)
H05K 13/00    (2006.01)

(52) U.S. Cl.
CPC ..... *H05K 13/0882* (2018.08); *H05K 13/0015* (2013.01); *H05K 13/0815* (2018.08)

(58) Field of Classification Search
CPC .................................................. H05K 13/0882
See application file for complete search history.

(56) References Cited

U.S. PATENT DOCUMENTS

| | | | |
|---|---|---|---|
| 2011/0283530 A1* | 11/2011 | Ao | H05K 13/0812 29/739 |
| 2012/0102726 A1 | 5/2012 | Kaida et al. | |
| 2017/0354073 A1 | 12/2017 | Oyama et al. | |
| 2018/0206369 A1* | 7/2018 | Takama | G06T 7/0004 |
| 2018/0263150 A1* | 9/2018 | Takama | H05K 13/0465 |

FOREIGN PATENT DOCUMENTS

| | | | | |
|---|---|---|---|---|
| CN | 109429478 B | * | 2/2021 | ......... G05B 19/402 |
| JP | 2009-206133 A | | 9/2009 | |
| JP | 2012-209300 A | | 10/2012 | |
| JP | 2020113586 A | * | 7/2020 | |
| JP | 2020145273 A | * | 9/2020 | |
| WO | WO 2016/098184 A1 | | 6/2016 | |

OTHER PUBLICATIONS

International Search Report mailed on Oct. 8, 2019 in PCT/JP2019/029050 filed on Jul. 24, 2019, 1 page.

* cited by examiner

*Primary Examiner* — Suresh Suryawanshi
(74) *Attorney, Agent, or Firm* — Oblon, McClelland, Maier & Neustadt, L.L.P.

(57) ABSTRACT

A mounting device includes a mounting section configured to pick up a component from a supply section that holds the component and execute a mounting process of the component on a mounting target, and a control section configured to acquire an inspection result obtained by executing an inspection process on the components placed on the mounting target and to notify an operator of the inspection result indicating that the component is defective at a timing before mounting an inspection resulted mounting component that is turned out to be mountable after the inspection result is determined.

5 Claims, 6 Drawing Sheets

Fig. 5

| SEQUENCE NUMBER | COMPONENT NUMBER | TYPE OF OPERATION | PICKUP AND PLACEMENT NUMBER(PP) | INSPECTION RESULT | NOTIFICATION TO OPERATOR |
|---|---|---|---|---|---|
| M1 | Pa1 | MOUNTING | PP1 | | |
| M2 | Pa2 | MOUNTING | PP1 | | |
| M3 | Pa3 | MOUNTING | PP1 | | |
| M4 | Pa4 | MOUNTING | PP1 | | |
| C1 | Pa1 | INSPECTION | | NG | |
| C2 | Pa2 | INSPECTION | | OK | |
| C3 | Pa3 | INSPECTION | | OK | |
| C4 | Pa4 | INSPECTION | | OK | |
| M5 | Pa5 | MOUNTING | PP2 | | |
| M6 | Pa6 | MOUNTING | PP2 | | |
| M7 | Pa7 | MOUNTING | PP2 | | |
| M8 | Pa8 | MOUNTING | PP2 | | |
| C5 | Pa5 | INSPECTION | | OK | |
| C6 | Pa6 | INSPECTION | | OK | |
| C7 | Pa7 | INSPECTION | | OK | |
| C8 | Pa8 | INSPECTION | | OK | |
| M9 | Pa9 | MOUNTING | PP3 | | |
| M10 | Pa10 | MOUNTING | PP3 | | |
| M11 | Pa11 | MOUNTING | PP3 | | |
| M12 | Pa12 | MOUNTING | PP3 | | |
| C9 | Pa9 | INSPECTION | | OK | |
| C10 | Pa10 | INSPECTION | | OK | |
| C11 | Pa11 | INSPECTION | | OK | |
| C12 | Pa12 | INSPECTION | | NG | |
| M13 | Pb1 | MOUNTING | PP4 | | |
| M14 | Pb2 | MOUNTING | PP4 | | |
| C13 | Pb1 | INSPECTION | | NG | |
| C14 | Pb2 | INSPECTION | | OK | |
| M15 | Pb3 | MOUNTING | PP5 | | |
| M16 | Pb4 | MOUNTING | PP5 | | |
| C15 | Pb3 | INSPECTION | | NG | |
| C16 | Pb4 | INSPECTION | | OK | |
| M17 | Pb5 | MOUNTING | PP6 | | |
| M18 | Pb6 | MOUNTING | PP6 | | |
| C17 | Pb5 | MOUNTING | | OK | |
| C18 | Pb6 | MOUNTING | | OK | |
| M19 | Pd1 | MOUNTING | PP7 | | |
| M20 | Pd2 | MOUNTING | PP7 | | |
| M21 | Pd3 | MOUNTING | PP8 | | |
| M22 | Pd4 | MOUNTING | PP8 | | |
| M23 | Pd5 | MOUNTING | PP9 | | |
| M24 | Pd6 | MOUNTING | PP9 | | NOTIFICATION |
| M25 | Pc1 | MOUNTING | PP10 | | |
| M26 | Pc2 | MOUNTING | PP11 | | |
| M27 | Pc3 | MOUNTING | PP12 | | |

Fig. 6

| SEQUENCE NUMBER | COMPONENT NUMBER | TYPE OF OPERATION | PICKUP AND PLACEMENT NUMBER(PP) | INSPECTION RESULT | NOTIFICATION TO OPERATOR |
|---|---|---|---|---|---|
| M1 | Pa1 | MOUNTING | PP1 | | |
| M2 | Pa2 | MOUNTING | PP1 | | |
| M3 | Pa3 | MOUNTING | PP1 | | |
| M4 | Pa4 | MOUNTING | PP1 | | |
| M5 | Pa5 | MOUNTING | PP2 | | |
| M6 | Pa6 | MOUNTING | PP2 | | |
| M7 | Pa7 | MOUNTING | PP2 | | |
| M8 | Pa8 | MOUNTING | PP2 | | |
| M9 | Pa9 | MOUNTING | PP3 | | |
| M10 | Pa10 | MOUNTING | PP3 | | |
| M11 | Pa11 | MOUNTING | PP3 | | |
| M12 | Pa12 | MOUNTING | PP3 | | |
| M13 | Pb1 | MOUNTING | PP4 | | |
| M14 | Pb2 | MOUNTING | PP4 | | |
| M15 | Pb3 | MOUNTING | PP5 | | |
| M16 | Pb4 | MOUNTING | PP5 | | |
| M17 | Pb5 | MOUNTING | PP6 | | |
| M18 | Pb6 | MOUNTING | PP6 | | |
| M19 | Pd1 | MOUNTING | PP7 | | |
| M20 | Pd2 | MOUNTING | PP7 | | |
| M21 | Pd3 | MOUNTING | PP8 | | |
| M22 | Pd4 | MOUNTING | PP8 | | |
| M23 | Pd5 | MOUNTING | PP9 | | |
| M24 | Pd6 | MOUNTING | PP9 | | |
| C1 | Pa1 | INSPECTION | | NG | |
| C2 | Pa2 | INSPECTION | | OK | |
| C3 | Pa3 | INSPECTION | | OK | |
| C4 | Pa4 | INSPECTION | | OK | |
| C5 | Pb1 | INSPECTION | | NG | |
| C6 | Pb2 | INSPECTION | | OK | NOTIFICATION |
| M25 | Pc1 | MOUNTING | PP10 | | |
| C7 | Pa5 | INSPECTION | | OK | |
| C8 | Pa6 | INSPECTION | | OK | |
| C9 | Pa7 | INSPECTION | | OK | |
| C10 | Pa8 | INSPECTION | | OK | |
| C11 | Pb3 | INSPECTION | | NG | |
| C12 | Pb4 | INSPECTION | | OK | NOTIFICATION |
| M26 | Pc2 | MOUNTING | PP11 | | |
| C13 | Pa9 | INSPECTION | | OK | |
| C14 | Pa10 | INSPECTION | | OK | |
| C15 | Pa11 | INSPECTION | | OK | |
| C16 | Pa12 | INSPECTION | | NG | |
| C17 | Pb5 | MOUNTING | | OK | |
| C18 | Pb6 | MOUNTING | | OK | NOTIFICATION |
| M27 | Pc3 | MOUNTING | PP12 | | |

MOUNTING DEVICE AND METHOD FOR CONTROLLING MOUNTING DEVICE

TECHNICAL FIELD

The present specification relates to a mounting device and a method for controlling the mounting device.

BACKGROUND ART

In the conventional art, as a mounting device, a device that recognizes a component mounting position by a recognition camera that is movably provided independently of a mounting head while the mounting head is picking up a component from a component supply section has been proposed. (refer to, for example, Patent Literature 1). In the mounting device, it is possible to improve a production efficiency by enabling an execution of the component mounting while performing inspection of the component mounting position (pre-inspection or post-inspection).

PATENT LITERATURE

Patent Literature 1: JP-A-2009-206133

BRIEF SUMMARY OF THE INVENTION

Technical Problem

However, in the mounting device in Patent Literature 1 described above, after the inspection result is determined to be defective, a timing for notifying of the inspection result was not considered. Therefore, in the mounting device, there is a problem in that an operator has to deal with the problem every time the inspection result indicating the defectiveness is obtained, and thus, the production efficiency is deteriorated. In addition, in the mounting device, a mounting process may be executed only for the component that is turned out to be mountable after the inspection result is determined. When executing the mounting process for such a component, it was necessary to consider the timing at which the inspection result is notified.

The present disclosure has been made in view of such problems, and a principal object of the present disclosure is to provide a mounting device and a method for controlling the mounting device, which can execute the production more efficiently.

Solution to Problem

The present disclosure employs the following means in order to achieve the above principal object.

A mounting device in the present disclosure includes a mounting section configured to pick up a component from a supply section that holds the component and mount the component on a mounting target, and a control section configured to acquire an inspection result obtained by executing an inspection process on the components placed on the mounting target and to notify an operator of the inspection result indicating that the component is defective at a timing before mounting an inspection resulted mounting component which becomes mountable after the inspection result is determined.

In the mounting device, the inspection result obtained by executing the inspection process on the components placed on the mounting target is acquired, and inspection result indicating the defectiveness is notified to the operator at the timing before mounting the inspection resulted mounting component that is turned out to be mountable after the inspection result is determined. Generally, when mounting the inspection resulted mounting component, the operator may deal with the inspection result indicating the defectiveness at every time the inspection result indicating the defectiveness is obtained. On the other hand, in the mounting device in the present disclosure, the operator is notified of the inspection result indicating the defectiveness at the timing before mounting the inspection resulted mounting component, that is, even if there are multiple inspection results indicating the defectiveness, since the inspection result is collectively notified to the operator at the timing before mounting, the operator can collectively deal with those defectives. Therefore, in the mounting device, production can be executed more efficiently by increasing the work efficiency of the operator. Here, the "inspection result indicating the defectiveness" includes an inspection result indicating a mounting error in which the deviation amount of the mounting position exceeds an allowable range, and an inspection result indicating a defective component that the function of the component itself is not appropriate.

BRIEF DESCRIPTION OF DRAWINGS

FIG. 5 is an explanatory diagram showing an example of a process order list in which a mounting process and an inspection process are alternately executed.

FIG. 6 is an explanatory diagram showing an example of a process order list in which the inspection processes are alternately executed after the mounting process.

DESCRIPTION OF EMBODIMENTS

Figure 1:
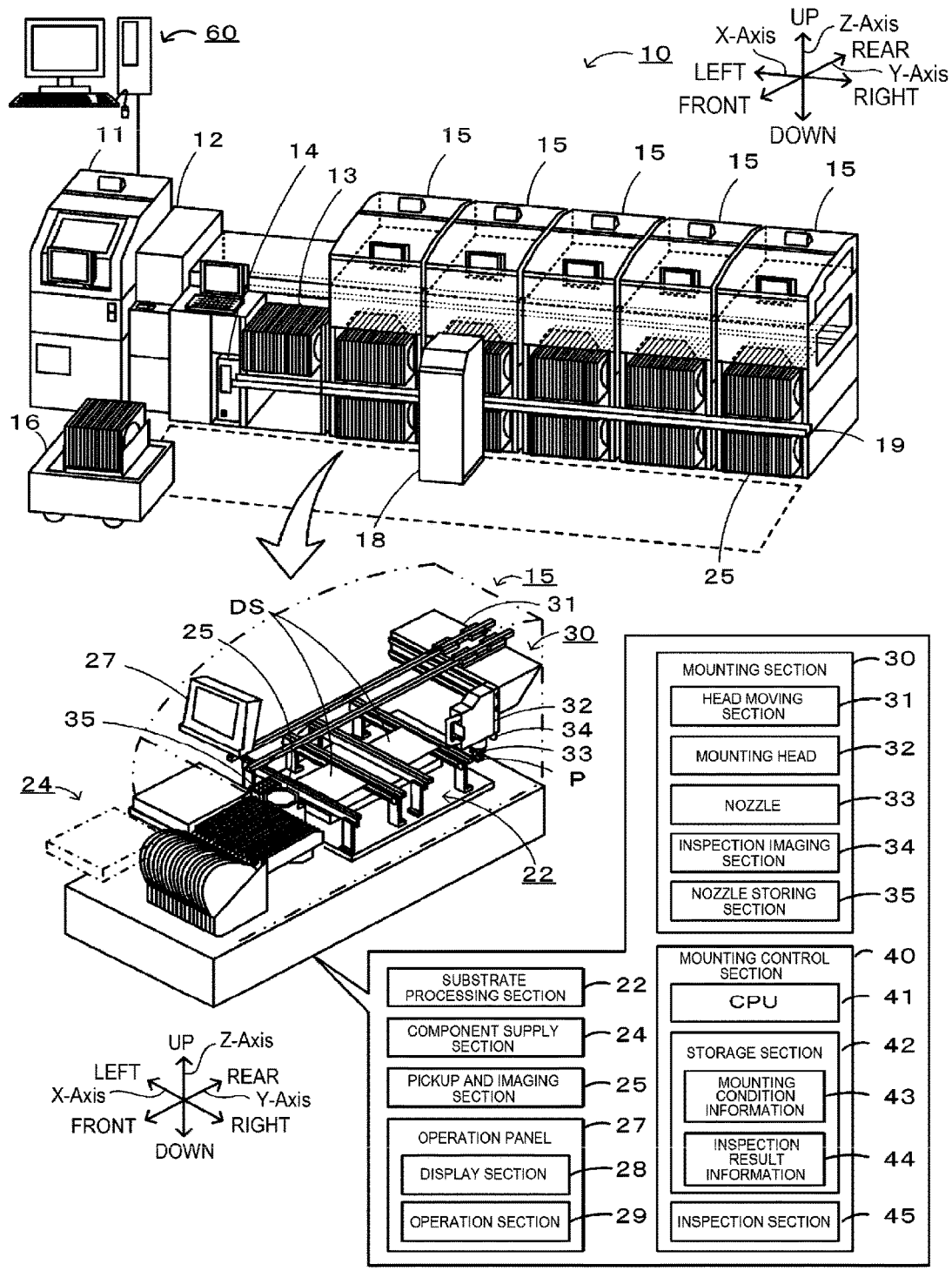
FIG. 1 is a schematic explanatory diagram showing an example of mounting system 10 and mounting device 15.
Figure 2:
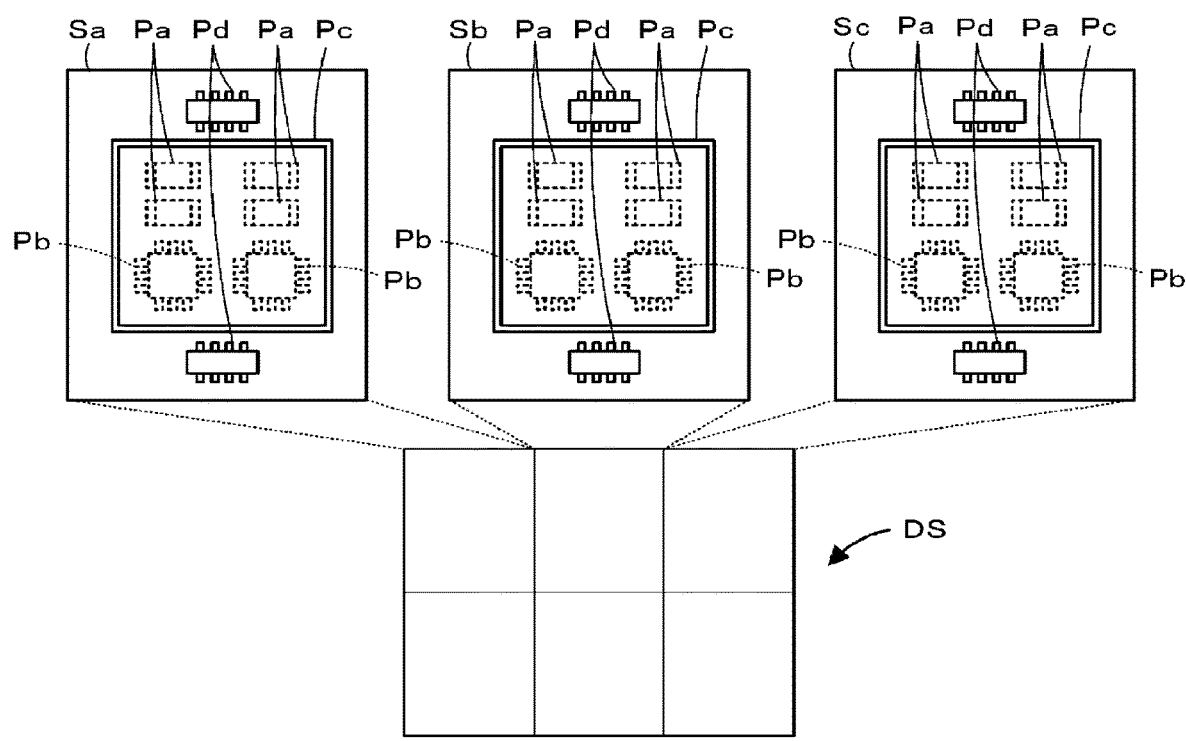
FIG. 2 is an explanatory diagram showing an example of board DS and substrate S.

Hereinafter, the present embodiment will be described with reference to the drawings. FIG. 1 is a schematic explanatory diagram showing an example of mounting system 10 and mounting device 15, which are the present disclosure. FIG. 2 is an explanatory diagram showing an example of board DS and substrate S. In the present embodiment, a left-right direction (X-axis), a front-rear direction (Y-axis), and an up-down direction (Z-axis) are as shown in FIG. 1.

Mounting system 10 is configured as, for example, a production line in which mounting devices 15 executing a mounting process for components P on substrate S serving as a mounting target are arranged in a conveyance direction of substrate S. Here, a mounting target is described as substrate S but is not particularly limited as long as component P is mounted thereon, and may be a substrate having a three-dimensional shape. As illustrated in FIG. 1, mounting system 10 is configured to include printing device 11, printing inspection device 12, storing section 13, management PC 14, mounting device 15, automatic conveyance vehicle 16, loader 18, host PC 60, and the like. Printing device 11 is a device that prints a solder paste or the like on substrate S. Printing inspection device 12 is a device that inspects a state of the printed solder.

Board DS is a mounting target that includes multiple substrates S. As shown in FIG. 2, board DS includes multiple substrates S1 to S3 in which components Pa to Pd are placed at the same position. Here, component Pa to Pd are collectively referred to as component P, and substrates S1 to S3 are collectively referred to as substrate S. Board DS is a board from which multiple substrate S can be obtained by dividing board DS by grooves formed on a top surface after the mounting process and the reflow process. In board DS, component Pc is a cover member arranged on the upper part of components Pa and Pb. Component Pc is an inspection resulted mounting component that is turned out to be mountable after the inspection result is determined that components Pa and Pb are placed at regular positions. Examples of the inspection resulted mounting component include, for example, an overlapping component that is placed in an overlapping manner in a placement region of other component P, a rare component having rarity such as an expensive component that is required to be avoided from being discarded with the defective substrates, a position-dependent component that is mounted depending on the placement position of other component, a function-dependent component that is mounted depending on the function in a mounting state of other component P, and the like. Examples of the overlapping component include a component that covers other component and a component that is placed on top of other component. Examples of the rare component include, for example, a special component that is not a general-purpose component. Examples of the position-dependent component include a component that cannot be placed if adjacent components are deviated. Examples of the function-dependent component include a resistor component mounted according to the resistance value of other component. Component Pc is an overlapping component that is placed in the placement region of other components Pa and Pb.

Mounting device 15 is a device for picking up component P and mounting component P on substrate S. In addition, mounting device 15 has a function of executing the mounting inspection process for inspecting a shortage of component on substrate S or a state of components placed on substrate S. Mounting device 15 includes substrate processing section 22, component supply section 24, pickup/imaging section 25, operation panel 27, mounting section 30, and mounting control section 40. Mounting control section 40 is configured as a microprocessor centered on CPU 41, and controls the entire device. Mounting control section 40 includes storage section 42 and inspection section 45. In storage section 42, mounting condition information 43, inspection result information 44, and the like are stored. Mounting condition information 43 is a production job, and includes information such as information on the component P, information on a placement order for mounting component P on substrate S, a placement position, and a mounting position for feeder 25 for picking up component P. In addition, in mounting condition information 43, information such as a regulation of the area and the order of substrates S on which the inspection process is performed, and the order of components P on which the inspection process is performed. Examples of the inspection process include, for example, a shortage inspection for inspecting the presence or absence of placement of component P, a positional deviation inspection for inspecting the positional deviation of component P, a function inspection for inspecting the function (for example, resistance value) of component P in the mounting state, and the like. Here, the shortage inspection and the positional deviation inspection will be mainly described. Inspection result information 44 is information or the like in which the inspection result of component P placed in substrate S is stored in association with substrate S. Inspection result information 44 is created at the time of the mounting process of component P and is updated after the inspection process. Inspection result information 44 is transmitted to host PC 60 and stored as a substrate information database for the production control. Inspection section 45 is a functional block that inspects a state of substrate S and a state of placed component P based on a difference between the image obtained by imaging substrate S and a reference image prepared in advance. Mounting control section 40 outputs a control signal to substrate processing section 22, component supply section 24, and mounting section 30, and inputs a signal from substrate processing section 22, component supply section 24, and mounting section 30.

Substrate processing section 22 is a unit for carrying in, conveying, fixing at a mounting position of board DS (substrate S), and conveying out. Substrate processing section 22 conveys board DS by a pair of conveyor belts provided at intervals in the front and rear in FIG. 2 and spanned in the left-right direction. Substrate processing section 22 includes two pairs of conveyor belts, and can convey and fix two substrate S at the same time. Component supply section 24 is a unit that supplies component P to mounting section 30. In component supply section 24, a feeder including a reel around which a tape is wound as a holding member holding component P is mounted on one or more attachment sections. In addition, component supply section 24 includes a tray unit having a tray as a holding member for placing multiple components P in an array. The tray unit supplies special components such as large component Pc that is a cover member and rare components having rarity that are more expensive than general component P.

Pickup/imaging section 25 is a device that captures an image of one or more components P in a state of being picked up and held by mounting head 32. Pickup/imaging section 25 is disposed between substrate processing section 22 and component supply section 24. An imaging range of pickup/imaging section 25 is above the pickup/imaging section 25. Pickup/imaging section 25 captures an image of component P when mounting head 32 holding component P passes above pickup/imaging section 25, and outputs the captured image to mounting control section 40. Based on the captured image, mounting control section 40 can execute the inspection of whether the shape and portion of component P are normal, detection of a deviation amount such as a position and a rotation of component P at the time of pickup, and the like.

Mounting section 30 is a unit that picks up component P from component supply section 24 and places the components to substrate S fixed to substrate processing section 22. Mounting section 30 includes head moving section 31, mounting head 32, nozzle 33, inspection imaging section 34, and nozzle storing section 35. Head moving section 31 includes a slider that is guided by a guide rail and moves in the XY-directions, and a motor that drives the slider. Mounting head 32 picks up one or more components P and moves the components in the XY-directions by head moving section 31. Mounting head 32 is detachably mounted on the slider. One or more nozzles 33 are detachably mounted on the lower surface of mounting head 32. Nozzle 33 picks up component P using the negative pressure. The pickup member that picks up component P may be a mechanical chuck that mechanically holds component P in addition to nozzle 33. Inspection imaging section 34 is a camera that images below mounting head 32, and for example, images a reference mark and a 2D code formed on substrate S in addition to imaging component P placed on substrate S.

Inspection/imaging section 34 is arranged on the lower surface side of the slider on which mounting head 32 is mounted, and moves in the XY-directions as mounting head 32 moves. Inspection/imaging section 34 outputs one or more image data of multiple substrate S (refer to FIG. 2) included in board DS on which components P are placed, to mounting control section 40. Mounting control section 40 analyzes this image data by inspection section 45 and outputs an inspection result. In addition, inspection/imaging section 34 images the code formed on an upper surface of substrate S. Mounting control section 40 can identify substrate S based on the code included in the captured image.

Storing section 13 is a storing place for temporarily storing the members used in mounting system 10. Examples of the members stored in storing section 13 include, for example, a feeder, mounting head 32, nozzle 33, a solder cartridge, a screen mask, a backup pin for supporting the substrate, and the like. Storing section 13 is provided at the lower portion of the conveyance device between printing inspection device 12 and mounting device 15. In storing section 13, the members may be carried by automatic conveyance vehicle 16 as well as by the operator. Management PC 14 is a device that manages the members in storing section 13. Automatic conveyance vehicle 16 automatically conveys the members used in mounting system 10 between a warehouse (not shown) and storing section 13. Feeders and other members are stored in the warehouse. Loader 18 is a mobile work device that moves along X-axis rail 19 within a moving region in front of mounting system 10 (refer to the dotted line in FIG. 1), and automatically collects and replenishes the members that are required for the mounting process such as feeder 25 of mounting device 15.

Host PC 60 (refer to FIG. 1) is configured as a server that stores and manages information used by each device of mounting system 10, such as production plan database including multiple mounting condition information 43 and substrate information database including multiple inspection result information 44.

Figure 3:
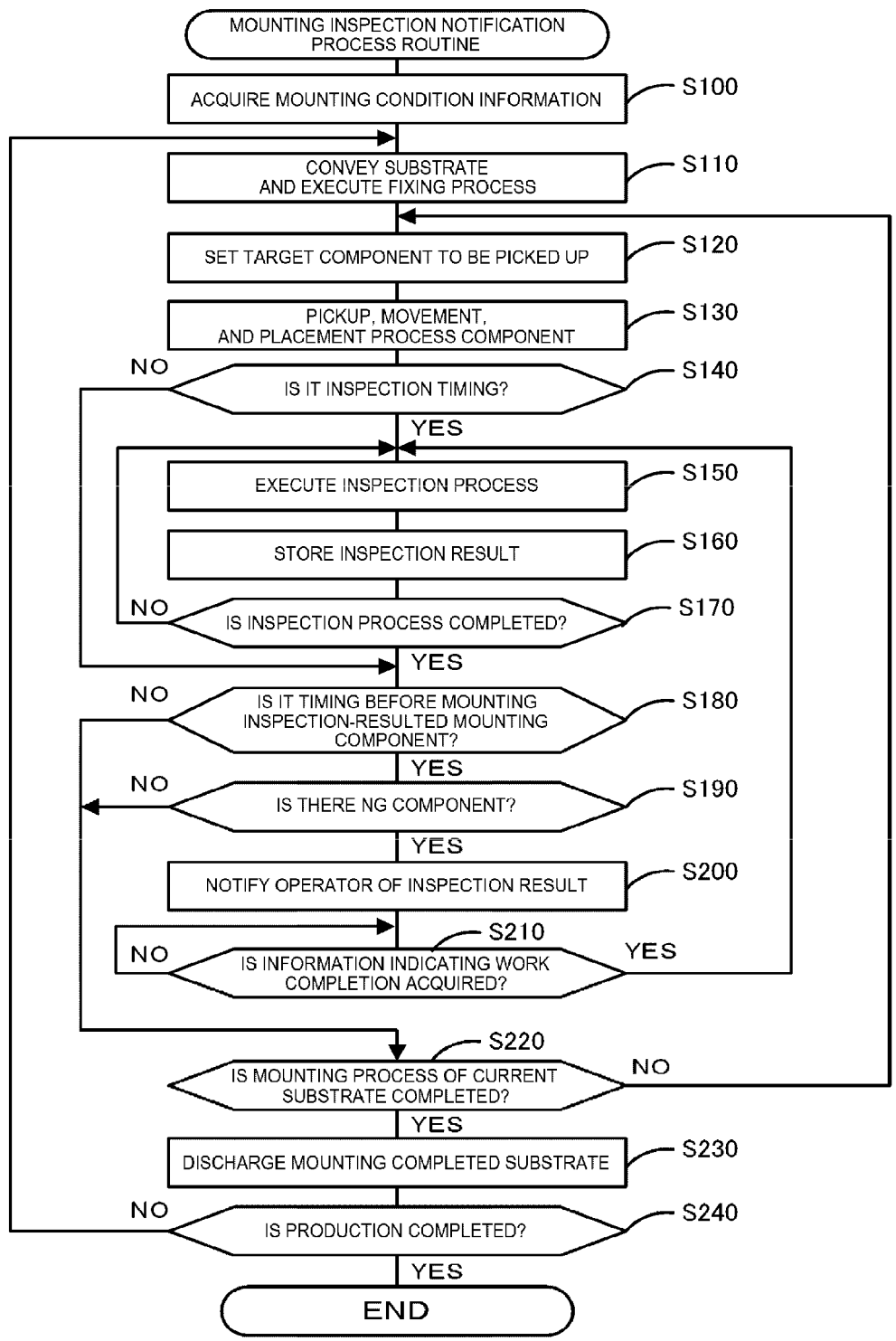
FIG. 3 is a flowchart showing an example of a mounting inspection notification process routine.

Next, the operation by mounting system 10 in the present embodiment configured in the way, first, the process of mounting component P to substrate S by mounting device 15, will be described. Here, for the convenience of explanation, the mounting process of component P on board DS will be described as the same as the mounting process of component P on substrate S. FIG. 3 is a flowchart showing an example of a mounting inspection notification process routine executed by CPU 41 of mounting control section 40 of mounting device 15. This routine is stored in storage section 42 of the mounting device 15 and is executed by the start instruction by the operator. When this routine is started, first, CPU 41 reads and acquires the mounting condition information on substrate S produced this time (S100). CPU 41 is assumed to read mounting condition information 43 acquired from host PC 60 and stored in storage section 42. Next, CPU 41 causes substrate processing section 22 to convey board DS to the mounting position, and to execute a fixing process (S110). Next, CPU 41 sets a target component to be picked up based on mounting condition information 43 (S120), causes mounting head 32 to pick up component P from the feeder or tray unit 5 at the position set in advance, and places the component at the placement position of substrate S included in board DS (S130).

Next, CPU 41 determines whether it is the inspection timing based on the processing order set in advance in mounting condition information 43 (S140). If it is the inspection timing, CPU 41 executes the inspection process (S150) and stores the inspection result in inspection result information 44 (S160). In the inspection process, CPU 41 moves mounting head 32 to the region where component P to be inspected is placed, and causes the causes inspection imaging section 34 to image the region. By comparing the captured image with the reference image by inspection section 45, the shortage of component P, the positional deviation amount of component P, the rotational deviation amount of component P, and the like are detected. After the subsequent process such as the reflow process, an allowance at which component P is fixed in an appropriate position is experimentally determined in advance, when the positional deviation amount or the rotational deviation amount exceeds this allowance, CPU 41 determines this component P as a defective component (NG). CPU 41 stores this determination result in inspection result information 44 as an inspection result. If there are multiple components P to be inspected in the imaging region of inspection/imaging section 34, CPU 41 repeatedly executes this process.

Next, CPU 41 determines whether the inspection process is completed based on the information in mounting condition information 43 (S170), and executes the processes subsequent to S150 when the inspection process is not completed. On the other hand, after the inspection process is completed, or when it is not the inspection timing in S140, CPU 41 determines whether it is the timing before the mounting process of the inspection resulted mounting component (S180). The inspection resulted mounting component refers to a component that is turned out to be mountable after the inspection result of another component P is determined, such as component Pc. CPU 41 executes this determination depending on whether the next is the inspection resulted mounting component based on mounting condition information 43. When it is not a timing before the mounting process of the inspection resulted mounting component, CPU 41 determines whether the mounting process of current substrate S (board DS) is completed (S220), and when the mounting process is not completed, executes the process after S120. That is, CPU 41 sets component P to be mounted next, and causes mounting section 30 to pick up, to move, and to place component P, and causes inspection imaging section 34 and inspection section 45 to execute the inspection process as needed.

On the other hand, when it is a timing before the mounting process of the inspection resulted mounting component in S180, CPU 41 reads inspection result information 44, and determines whether there is component P whose inspection result is defective (NG) between the timing before the mounting processing of the previous inspection resulted-mounted component and the current timing (S190). When there is no defective component P, CPU 41 executes the process subsequent to S220 without notifying the operator in particular. On the other hand, when there is defective component P, CPU 41 collectively notifies the operator of the information on the inspection result of corresponding component P (S200), and waits in that state. CPU 41 is assumed to execute the display process for the information on the inspection result on operation panel 27. In addition to the display process, CPU 41 may notify the operator by sound, lighting of a warning lamp, or the like. The operator corrects the position of defective component P on substrate S based on the display contents in operation panel 27, operates operation section 29, and performs the input of the work completion. CPU 41 determines whether the information indicating the work completion is acquired from operation panel 27 (S210), and waits as it is when the information on the work completion is not acquired. On the other hand, when the information on the work completion is acquired in S210, the processes subsequent to S150 are executed. That is, CPU 41 executes the inspection process on corrected component P, makes the inspection result updated, and if the inspection result is within the allowance, executes the mounting process of the next inspection resulted mounting component.

On the other hand, when the mounting process of current substrate S is completed in S220, CPU 41 causes substrate processing section 22 to discharge the mounting completed substrate S (board DS) (S230), and determined whether the production of all substrates S set in mounting condition information 43 is completed (S240). When the production of all substrate S is not completed, CPU 41 executes the processing subsequent to S110, and when the production of all substrate S is completed, this routine completes.

Figure 4:
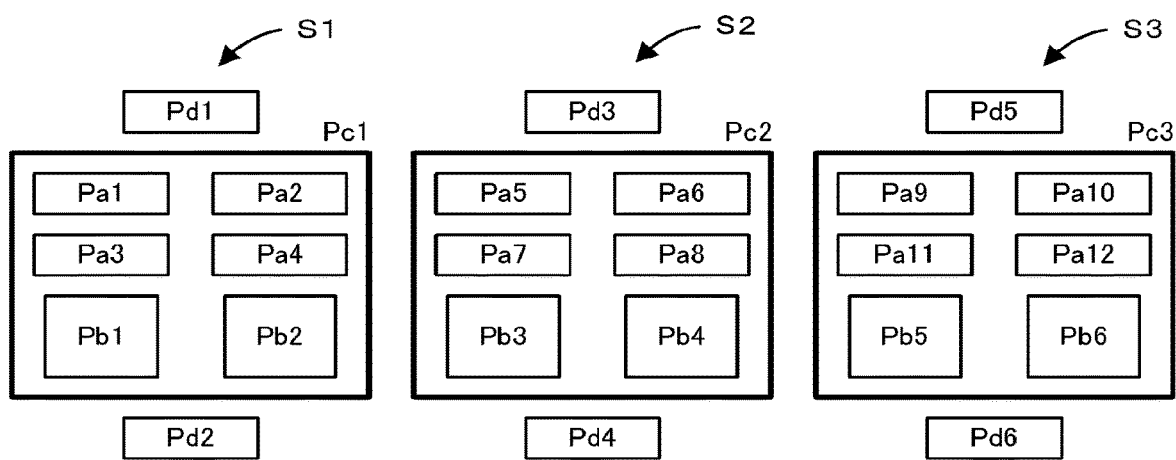
FIG. 4 is an explanatory diagram showing substrates S1 to S3 as a specific example for explaining the mounting inspection notification process.

Here, a specific example of the mounting inspection notification process described above will be described. FIG. 4 is an explanatory diagram of substrates S1 to S3 as a specific example for explaining the mounting inspection notification process. FIG. 5 is an explanatory diagram showing an example of a process order list in which a mounting process and an inspection process are alternately executed. In addition, FIG. 6 is an explanatory diagram showing an example of a process order list in which the inspection processes are alternately executed after the mounting process. FIG. 4 shows an example of mounting the same type of inspection resulted mounting component Pc on each of substrates S1 to S3. FIG. 5 is an example of notifying of the inspection result indicating the defectiveness at a timing before collectively mounting the inspection resulted mounting components Pc on multiple substrates S1 to S3. In addition, FIG. 6 shows an example of notifying of an inspection result indicating the defectiveness at a timing before mounting the inspection resulted mounting component Pc for each substrate S1 to S3. As shown in FIG. 4, CPU 41 is assumed to execute the mounting process and the inspection process in an order of the numbers assigned to components Pa to Pd. In addition, in FIG. 5 and FIG. 6, mounting head 32 can pick up four components Pa, can pick up two components Pb and Pd, and can pick up one component Pc in one pickup placement. For the convenience of explanation, the inspection process of component Pd is omitted in FIGS. 5 and 6.

As shown in FIG. 5, CPU 41 executes the inspection process of components Pa1 to Pa4 after the pickup placement of components Pa1 to Pa4, and stores the inspection result in inspection result information 44. Similarly, CPU 41 executes the inspection process after the pickup placement of components Pa5 to Pa8, executes the inspection process after the pickup placement of components Pa9 to Pa12, and stores the inspection result in inspection result information 44. In addition, CPU 41 executes the inspection process after the pickup placement of components Pb1 to Pb2, executes the inspection process after the pickup placement of components Pb3 to Pb4, executes the inspection process after the pickup placement of components Pb5 to Pb6, and stores the inspection result in inspection result information 44. Furthermore, CPU 41 executes the pickup placement of components Pd1 to Pd6. Then, after the sequence number M24, since it is a timing before mounting process of inspection resulted mounting component Pc (S180), CPU 41 collectively notifies the operator of the defective components P (S200). For example, if it is assumed that the information is notified to the operator each time the defective component occurs, the operator will perform the work of sequence numbers C1, C12, C13, and C15 in FIG. 5, and will go to corresponding mounting device 15 many times. In addition, in mounting device 15 also, the processes are interrupted at sequence numbers C1, C12, C13, and C15. On the other hand, in the example in FIG. 5, since the operator is collectively notified of the information when the sequence number is M24, it is possible to work collectively for all the defective components, and thus, the efficiency is extremely high. In addition, in the example in FIG. 5, even in mounting device 15, the mounting process can be continued even if defective component P is detected, and the process is interrupted only at sequence number M24, and thus, the efficiency is extremely high. Furthermore, in the example in FIG. 5, the frequency of defect notification is low as compared to the case of defect notification before switching to the mounting process after the inspection process, and thus, the efficiency is extremely high.

As shown in FIG. 6, CPU 41 executes the pickup placement of components Pb1 to Pb6, and executes the pickup placement of components Pd1 to Pd6 after executing the pickup placement of the components Pa1 to Pa12. Next, CPU 41 executes the inspection process on components Pa1 to Pa4 and Pb1 to Pb2 on substrate S1, and notifies the operator of the inspection result after sequence number C6 (S200), and then picks up and places component Pc1. Subsequently, CPU 41 executes the inspection process on components Pa5 to Pa8 and Pb3 to Pb4 on substrate S2, and notifies the operator of the inspection result after sequence number C12 (S200), and then picks up and places component Pc2. Then, CPU 41 executes the inspection process on components Pa9 to Pa12 and Pb5 and Pb6 on substrate S3, and notifies the operator of the inspection result after sequence number C18 (S200), and then picks up and places component Pc3. For example, if the information is notified to the operator each time the defective component occurs, the operator will perform the work of sequence numbers C1, C5, C11 and C16 in FIG. 6, and will go to corresponding mounting device 15 many times. In addition, in mounting device 15 also, the processes are interrupted at sequence numbers C1, C5, C11, and C16. On the other hand, in the example in FIG. 6, since the operator is collectively notified of the information when the sequence number is C6, C12, and C18, it is possible to work collectively for all the defective components, and thus, the efficiency is extremely high. In addition, in the example in FIG. 6, even in mounting device 15, the mounting process can be continued even if defective component P is detected, and the process is interrupted only at sequence number C6, C12, and C18, and thus, the efficiency is extremely high.

Here, the correspondence between the components in the present embodiment and the components in the present disclosure will be clarified. Mounting section 30 in the present embodiment corresponds to a mounting section, mounting control section 40 corresponds to a control section, inspection imaging section 34 corresponds to an inspection imaging section, inspection section 45 corresponds to an inspection section, and component Pc corresponds to an inspection resulted mounting component. In the present embodiment, an example of the method for controlling of the mounting device in the present disclosure is also clarified by explaining the operation of mounting device 15.

In mounting device 15 in the present embodiment described above, the inspection result obtained by performing the inspection process using the captured image of substrate S as the mounting target is acquired, and the inspection result indicating that the placement of component P is defective is notified to the operator at the timing before mounting inspection resulted mounting component Pc that is turned out to be mountable after the inspection result is determined. Generally, when mounting the inspection resulted mounting component, the operator may deal with the inspection result indicating the defectiveness at every time the inspection result indicating the defectiveness is obtained. On the other hand, in the mounting device 15, since the inspection result indicating the defectiveness is collectively notified to the operator at the timing before mounting the inspection resulted mounting component, the operator can deal with the defectives collectively. Therefore, in the mounting device 15, the production of substrate S can be executed more efficiently by increasing the work efficiency of the operator. In addition, in mounting device 15, since the temporary stop of mounting device 15 can be suppressed, it is possible to execute the production of substrate S more efficiently.

In addition, mounting device 15 may include inspection imaging section 34 for imaging substrate S, and mounting control section 40 may execute the inspection process of the mounting target using the captured image by inspection imaging section 34. Since this mounting device has an inspection function and can execute the mounting process while performing the inspection process, it is possible to execute the production more efficiently. Furthermore, since the inspection resulted mounting component is an overlapping component that is placed in an overlapping manner in a placement region of other components, and is a component that can be mounted depending on the inspection result, it is possible to more efficiently execute the production by notifying the operator of the inspection result indicating the defectiveness at the timing before mounting. Furthermore, in addition, the mounting target is board DS in which the same type of inspection resulted mounting components Pc are mounted on multiple substrates S, and mounting control section 40 notifies of the inspection result indicating the defectiveness at a timing before collectively mounting inspection resulted mounting components Pc on multiple substrates S or notifies of the inspection result indicating the defectiveness at a timing before mounting inspection resulted mounting component Pc for each substrate S. In the mounting device 15, when notifying of the inspection result at the timing before collectively mounting inspection resulted mounting components Pc on multiple substrates S, it is possible to notify of the inspection result indicating the defectiveness collectively for board DS, and thus, it is more efficient. In addition, when notifying of the inspection result at the timing before mounting inspection resulted mounting components Pc for each substrate S, it is possible to notify of the inspection result indicating the defectiveness collectively for each substrate S. In addition, in mounting device 15, the inspection process is one or more of a shortage inspection for inspecting the presence or absence of a placement of components P, a positional deviation inspection for inspecting a positional deviation of components P, and a function inspection for inspecting a function of component P in a mounting state, it is possible to execute the production more efficiently for the components that become mountable after performing the shortage inspection, the positional deviation inspection, and the function inspection.

The present disclosure is not limited to the embodiment described above, and needless to say, the present disclosure may be executed in various modes without departing from the technical scope thereof.

For example, in the embodiment described above, mounting device 15 includes inspection imaging section 34 and has an inspection function based on a captured image, but not particularly limited to this, and any sections may perform the inspection of component P. For example, mounting device 15 may be a measurement section that measures the functional value of component P, and may perform the inspection process using the functional value. Even with this mounting device 15, the production of substrate S can be executed more efficiently. In addition, in the embodiment described above, the inspection process is described as the shortage inspection and the positional deviation inspection, but may be a function inspection.

In the embodiment described above, the inspection resulted mounting component is described as a component mounted in a region overlapping with other components P, but not particularly limited to this, and may be a rare component, a position-dependent component, or a function-dependent component.

In the embodiment described above, board DS including multiple substrate S is described as the mounting target, but substrate S may be used as the mounting target. Since board DS includes multiple inspection resulted mounting components, it is possible to receive more effects of executing the production of substrate S more efficiently.

In the embodiment described above, mounting device 15 is described as the present disclosure, but may be the method for controlling the mounting device or a program that realizes the method for controlling the mounting device.

Here, the mounting device, the information processing device, and the mounting method in the present disclosure may be configured as follows. For example, the mounting device in the present disclosure may include an imaging section configured to image the mounting target, and the control section may include a measurement section configured to execute an inspection process of the mounting target using a captured image captured by the imaging section or to measure a function of the component in a state of being mounted on the mounting target, and the control section may execute the inspection process of the mounting target using a result of measurement by the measurement section.

Since this mounting device has an inspection function and can execute the mounting process while performing the inspection process, it is possible to execute the production more efficiently.

In the mounting device in the present disclosure, the inspection resulted mounting component may be one or more of an overlapping component that is placed in an overlapping manner in a placement region of other component, a rare component having rarity, a position-dependent component that is mounted depending on the placement position of other component, and a function-dependent component that is mounted depending on the function in a mounting state of other component. The overlapping component, the rare component, the position-dependent component, and the function-dependent component can be mounted depending on the inspection result, and it is possible to execute the production more efficiently by notifying the operator of the inspection result indicating the defectiveness at the timing before mounting.

In the mounting device in the present disclosure, the mounting target may be a board including multiple substrates for placing component, and the board may a board in which the same type of inspection resulted mounting components are mounted on each of the substrates, and the control section may notify of the inspection result indicating the defectiveness at a timing before collectively mounting the inspection resulted mounting components on the multiple substrates or may notify of the inspection result indicating the defectiveness at a timing before mounting the inspection resulted mounting component for each substrate. In the mounting device, when notifying of the inspection result at the timing before collectively mounting the inspection resulted mounting components on the multiple substrates, it is possible to notify of the inspection result indicating the defectiveness collectively for the board, and thus, it is more efficient. In addition, when notifying of the inspection result at the timing before mounting the inspection resulted mounting components for each substrate, it is possible to notify of the inspection result indicating the defectiveness collectively for each substrate.

In the mounting device in the present disclosure, the inspection process may include one or more of a shortage inspection for inspecting the presence or absence of a placement of the component, a positional deviation inspection for inspecting a positional deviation of the component, and a function inspection for inspecting a function of the component in a mounting state. In the mounting device, it is possible to execute the production more efficiently for the components that become mountable after performing the shortage inspection, the positional deviation inspection, and the function inspection.

The method for controlling the mounting device in the present disclosure including a mounting section configured to pick up a component from a supply section that holds the component and execute a mounting process of the component on a mounting target. The method includes (a) a step of acquiring an inspection result of the mounting target obtained by performing an inspection process using a captured image of the mounting target, and (b) a step of notifying an operator of the inspection result indicating the defectiveness at the timing before mounting an inspection resulted mounting component that is turned out to be mountable after the inspection result is determined.

In the method for controlling the mounting device, similarly to the mounting device described above, since the operator can collectively deal with multiple inspection results indicating the defectiveness, it is possible to more efficiently execute the production by increasing the work efficiency of the operator. In the method for controlling the mounting device, the above-described aspect of the mounting device may be adopted, or a step of expressing the function of the above-described mounting device may be included.

INDUSTRIAL APPLICABILITY

A mounting device and a method for controlling the mounting device in the present disclosure can be used in a field of mounting electronic components.

REFERENCE SIGNS LIST

10 mounting system, 11 printing device, 12 printing inspection device, 13 storing section, 14 management PC, 15 mounting device, 16 automatic conveyance vehicle, 18 loader, 19 X-axis rail, 22 substrate processing section, 24 component supply section, 25 pickup/imaging section, 27 operation panel, 28 display section, 29 operation section, 30 mounting section, 31 head moving section, 32 mounting head, 33 nozzle, 34 inspection imaging section, 35 nozzle storing section, 40 mounting control section, 41 CPU, 42 storage section, 43 mounting condition information, 44 inspection result information, 45 inspection section, 60 host PC, DS board, P, Pa to Pd component, S substrate

The invention claimed is:

1. A mounting device comprising:
    a mounting section configured to pick up a component from a supply section that holds the component and execute a mounting process of the component on a mounting target; and
    a control section configured to acquire an inspection result obtained by executing an inspection process on the component placed on the mounting target and to notify an operator of the inspection result indicating that the component is defective at a timing before mounting an inspection resulted mounting component that is turned out to be mountable after the inspection result is determined,
    wherein the inspection resulted mounting component is one or more of an overlapping component that is placed in an overlapping manner in a placement region of other component, a rare component having rarity, a position-dependent component that is mounted depending on a placement position of other component, and a function-dependent component that is mounted depending on a function in a mounting state of other component.

2. The mounting device according to claim 1,
    wherein an imaging section configured to image the mounting target is provided and the control section executes an inspection process of the mounting target using a captured image captured by the imaging section or
    a measurement section configured to measure a function of the component in a state of being mounted on the mounting target is provided, and the control section executes the inspection process of the mounting target using a result of measurement by the measurement section.

3. The mounting device according to claim 1,
    wherein the mounting target is a board including multiple substrates for placing a component, and the board is a board in which the same type of the inspection resulted mounting component is mounted on each of the substrates, and
    the control section notifies of the inspection result indicating the defectiveness at a timing before collectively mounting the inspection resulted mounting components on the multiple substrates or notifies of the inspection result indicating the defectiveness at a timing before mounting the inspection resulted mounting component for each substrate.

4. The mounting device according to claim 1
    wherein the inspection process includes one or more of a shortage inspection for inspecting a presence or absence of a placement of the component, a positional deviation inspection for inspecting a positional deviation of the component, and a function inspection for inspecting a function of the component in a mounting state.

5. A method for controlling a mounting device including a mounting section configured to pick up a component from a supply section that holds the component and execute a mounting process of the component on a mounting target, comprising:
    (a) a step of acquiring an inspection result of the mounting target obtained by performing an inspection process using a captured image of the mounting target, the inspection resulted mounting component is one or more of an overlapping component that is placed in an overlapping manner in a placement region of an other component, a rare component having rarity, a position-dependent component that is mounted depending on a placement position of other component, and a function-dependent component that is mounted depending on a function in a mounting state of other component; and (b) a step of notifying an operator of the inspection result indicating that the component is defective at a timing before mounting an inspection resulted mounting component that is turned out to be mountable after the inspection result is determined.

* * * * *